(12) United States Patent
Eng et al.

(10) Patent No.: US 6,399,403 B1
(45) Date of Patent: Jun. 4, 2002

(54) METHOD OF FABRICATING A SEMICONDUCTOR MESA DEVICE

(75) Inventors: Julie Eng, Upper Macungie Township; Jerome Levkoff, Sinking Spring; Anthony D. Mazzatesta, West Reading; Erick John Michel, Reading; Daniel Christopher Sutryn, Wyomissing Hills, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/378,032

(22) Filed: Aug. 20, 1999

(51) Int. Cl.[7] .................. H01L 21/302; H01L 21/00
(52) U.S. Cl. ............................... 438/22; 438/31
(58) Field of Search ....................... 438/22, 24, 31, 438/39, 40, 41, 42, 43, 44, 46, 47, 483, 697, 701, 713, 718, 745, 978

(56) References Cited

U.S. PATENT DOCUMENTS

| | | | | |
|---|---|---|---|---|
| 5,771,321 A | * | 6/1998 | Stern ........................ | 385/31 |
| 5,862,168 A | * | 1/1999 | Schilling et al. ............ | 372/50 |
| 5,888,844 A | * | 3/1999 | Bestwick et al. ............ | 438/46 |
| 6,052,397 A | * | 4/2000 | Jeon et al. .................... | 372/46 |
| 6,162,655 A | * | 12/2000 | Jhonson et al. .............. | 438/31 |
| 6,180,429 B1 | * | 1/2001 | Anselm et al. ............... | 438/22 |
| 6,194,240 B1 | * | 2/2001 | Chiu et al. ................... | 438/31 |

* cited by examiner

Primary Examiner—Savitri Mulpuri

(57) ABSTRACT

The invention is a method of fabricating a semiconductor device involving selectively etching at least a first semiconductor layer on a semiconductor wafer so as to perform a lateral taper etch in said layer, forming a second layer over the resulting etched region so as to planarize the etched area, and subsequently performing a second etch over a portion of the etched region so as to form a mesa geometry. This material allows device fabrication with a lateral taper, beneficial to monolithic integration of devices, such as expanded beam lasers, while reducing or eliminating unwanted increases in mesa width (mesa bulge) resulting from the lateral taper.

8 Claims, 7 Drawing Sheets

METHOD OF FABRICATING A SEMICONDUCTOR MESA DEVICE

FIELD OF THE INVENTION

This invention relates to semiconductor devices, and in particular to forming such devices which include a mesa geometry.

BACKGROUND OF THE INVENTION

Typical semiconductor optoelectronics devices, such as lasers, involve forming a mesa in order to define the lateral dimensions of the device. For example, a standard fabrication sequence includes epitaxially forming several semiconductor layers on a semiconductor wafer, and then selectively etching the layers to form plateaus or mesas, thereby defining the individual devices.

One particular device which is receiving increasing attention is the Expanded Beam Laser (XBL). This type of laser is fabricated by removal of part of the active region in such a way as to direct the light beam toward an underlying waveguide layer. The waveguide layer is designed to allow the light to expand, or diverge, as is propagates. The fabrication of such devices typically includes a diagonal lateral taper etch of the epitaxial layers across the axial mesa direction prior to mesa etching in order to couple the light beam into the waveguide. (See, e.g., U.S. Patent Application of Johnson 6-19-8-1-3, Serial No. 09/228218, filed Jan. 11, 1999 and assigned to Lucent.) Upon mesa etching, undesirable morphology can be created at the intersection of the mesa and lateral taper etch regions. This results in unequal amounts of residual material on either side of the mesa stripe, producing a bulge in the mesa. This mesa bulge can cause significant reliability problems.

It is, therefore, desirable to provide a process for forming mesa devices which reduces or eliminates the formation of mesa bulge.

SUMMARY OF THE INVENTION

The invention is a method of fabricating semiconductor devices including the steps of selectively etching at least a first semiconductor layer on a semiconductor wafer so as to perform a lateral taper etch in said layer, forming a second layer over the etched region so as to planarize the etched area, and subsequently performing a second etch in a portion of the etched area so as to form a mesa geometry.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
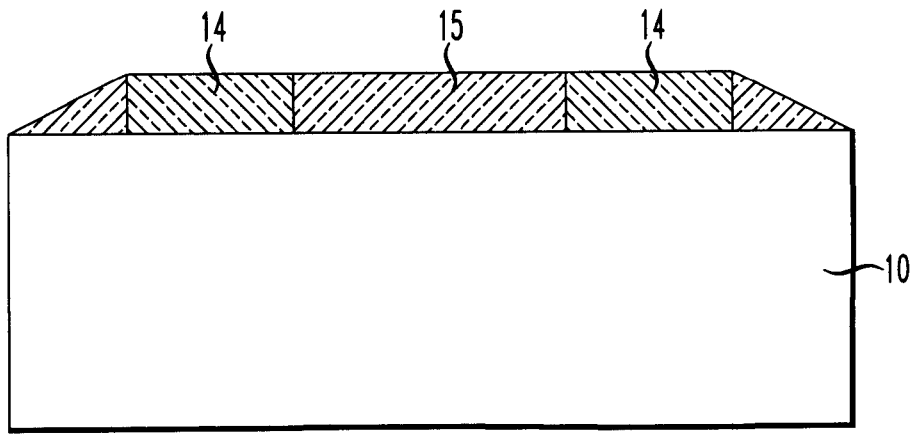
FIGS. 1–10 are cross sectional views of a device during various stages of fabrication including inventive steps in accordance with an embodiment of the invention.

As shown in FIG. 1, the fabrication of a typical expanded beam laser starts with a wafer, 10, which in this example is InP. It will be appreciated that several devices are fabricated from a single wafer, but for purposes of illustration (with the exception of FIGS. 11 and 12) only a single device will be shown.

As also illustrated in FIG. 1, selective area growth (also known in the art as SAG) was performed by first forming an oxide mask, 14, on selected portions of wafer 10 by standard photolithography. This was followed by epitaxially forming a semiconductor layer, 15, on the exposed areas of the wafer. The layer, 15, forms the waveguide for the final device, and typically comprises InGaAsP capped top and bottom with InP. The epitaxially layer was grown by metallorganic chemical vapor deposition (MOCVD) and will not deposit on the oxide mask.

Figure 2:
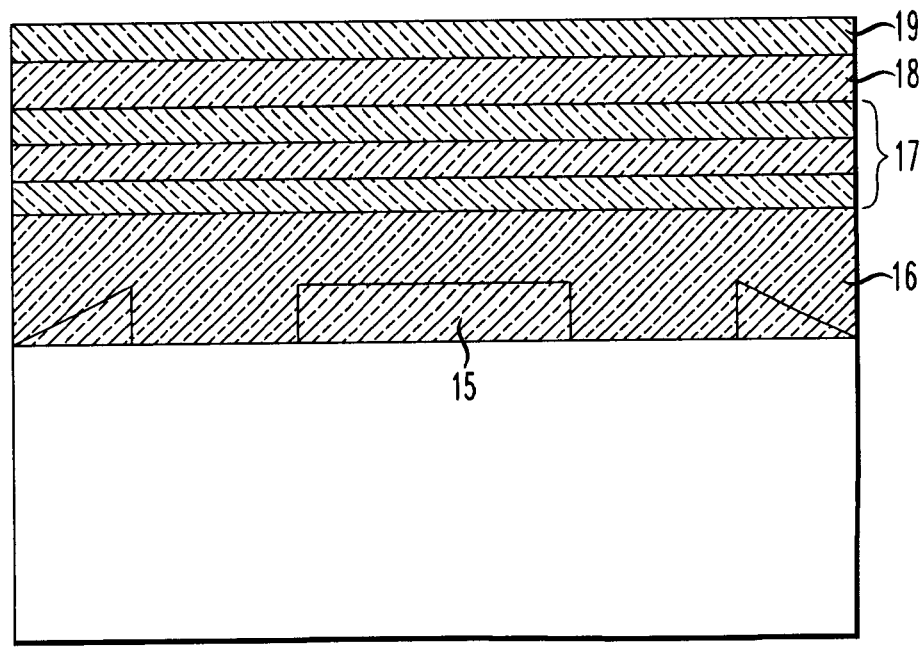

In subsequent steps, as illustrated in FIG. 2, the oxide mask, 14, was removed and a plurality of semiconductor layers, 16–19, were epitaxially grown over the waveguide, 15, and over areas vacated by removing the oxide mask 14. The first layer, was a separate confinement heterostructure (SCH), 16, which is usually n-type InGaAsP. Then, a plurality of quantum well layers, designated 17, were formed by standard techniques. These layers were alternate layers of compositionally different InGaAsP and comprise the active material of the device. An additional confinement layer, 18, comprising p-InGaAsP was then grown over the quantum well layers, 17. A p-InP cladding layer, 19, was then grown over layer 18 to further isolate the active material.

Figure 3:
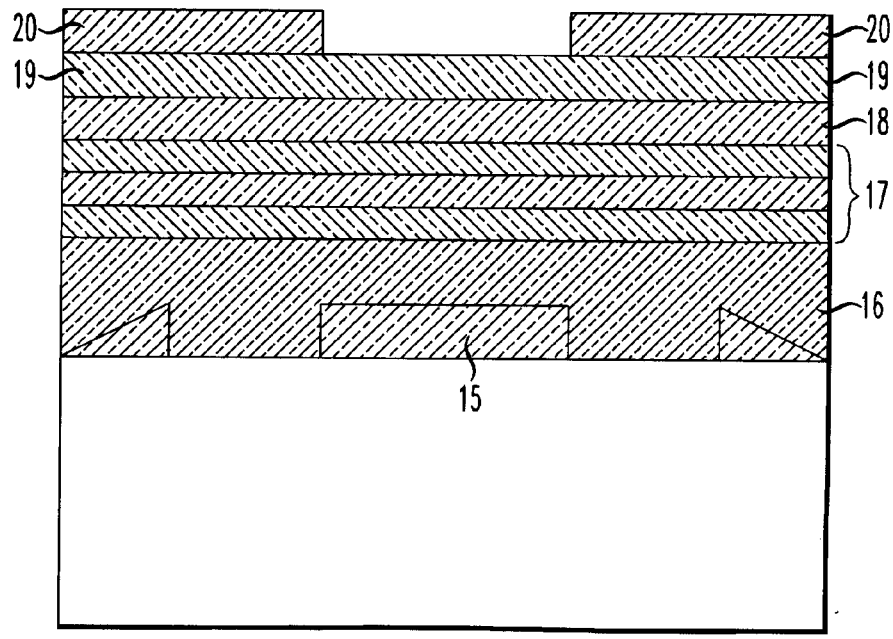
Figure 11:
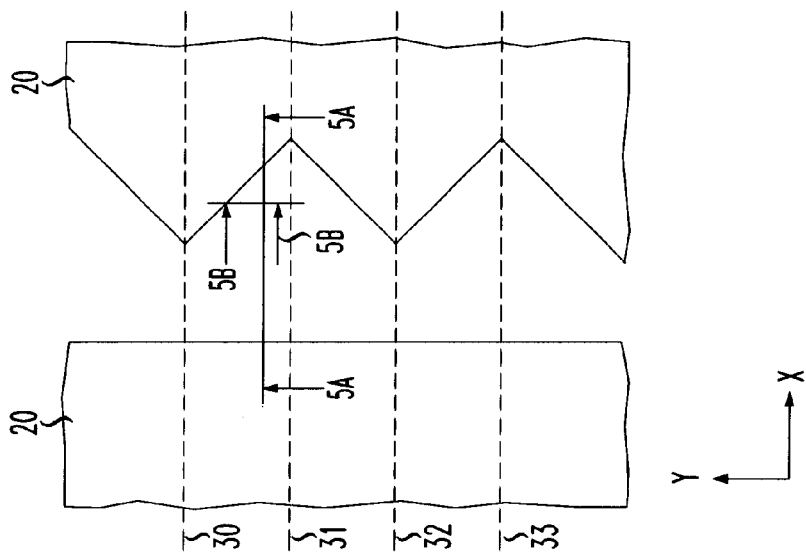

In order to perform the lateral taper etch, a lateral taper oxide or photoresist mask, 20, was formed over the resulting structure as illustrated in the cross sectional view of FIG. 3 and the plan view of FIG. 11, the latter showing a portion of the wafer, 10, from which a plurality of devices were formed. The lines designated 30–33 in FIG. 11 indicate the boundaries for individual devices. The mask, 20, included a saw tooth shape to form the tapered feature so that specified areas of the quantum well layers in each device could be etched diagonally along the axial direction of the device. The mask 20 in this example was silicon dioxide.

Figure 4:
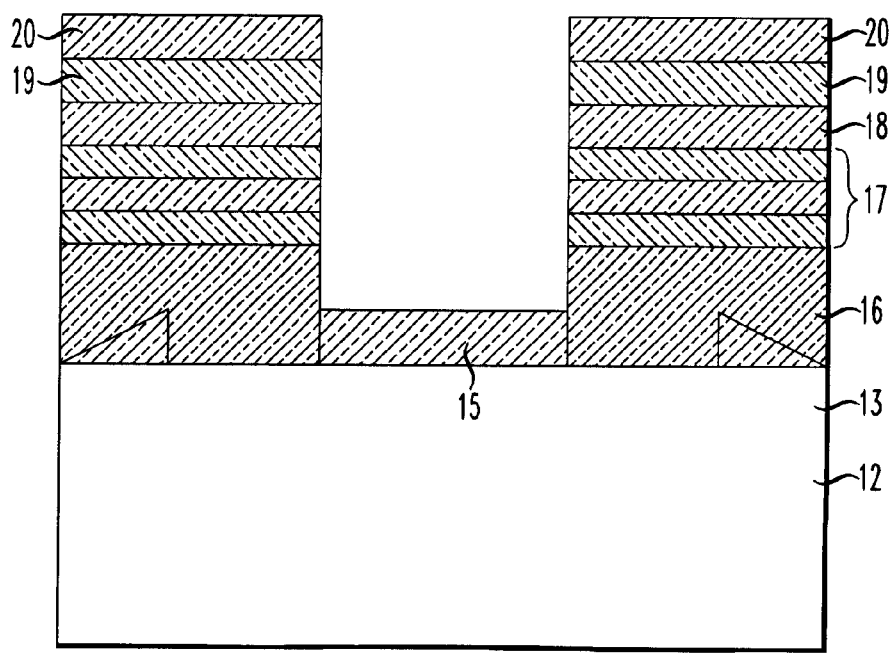

The portions of layers 16–19 not protected by mask, 20, were then etched as illustrated in FIG. 4. This can be accomplished, for example, by two wet chemical etches, one etch employing a combination of HCl and $H_3PO_4$ to etch the InP layer, 19, and the other etch employing a combination of $H_2SO_4 H_2O_2$ and $H_2O$ to etch the InGaAsP layers 16–18. Alternatively, a reactive ion etch followed by a clean-up wet chemical etch may be used. It will be noted that the structure is etched through the multi quantum well layers, 17, in the exposed areas of the mask, 20, but not through the waveguide layer, 15. Due to the saw tooth pattern of mask, 20, only specific areas of the layers 16–19 are etched. (Compare also FIGS. 9 and 10 which show portions of the device in later fabrication where partial and no etching of these layers occurred). This tapered etch allows the expanded beam device to couple light into the waveguide, but is also the cause of mesa bulge in later fabrication.

Figure 5A:
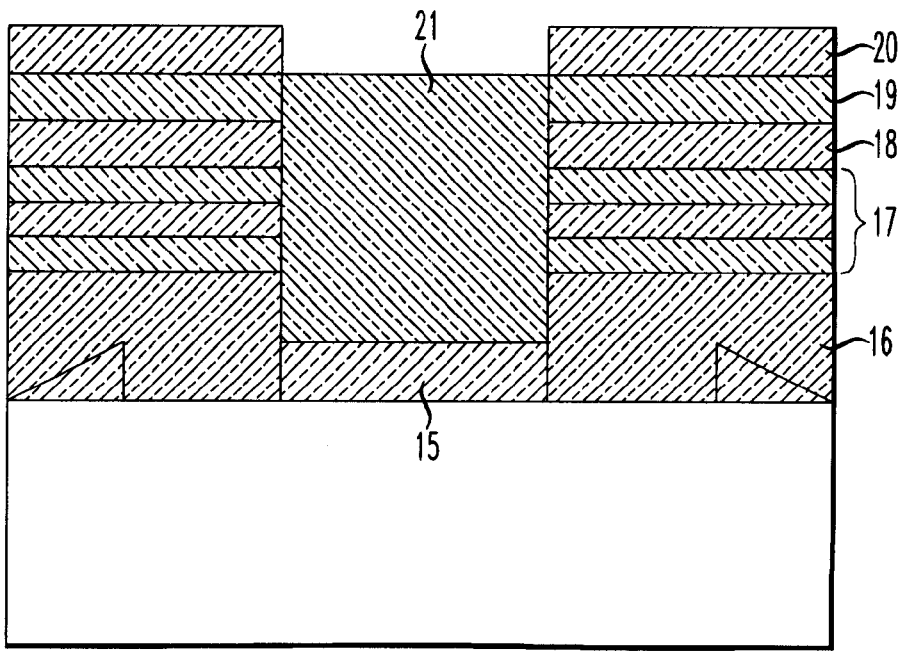
Figure 5B:
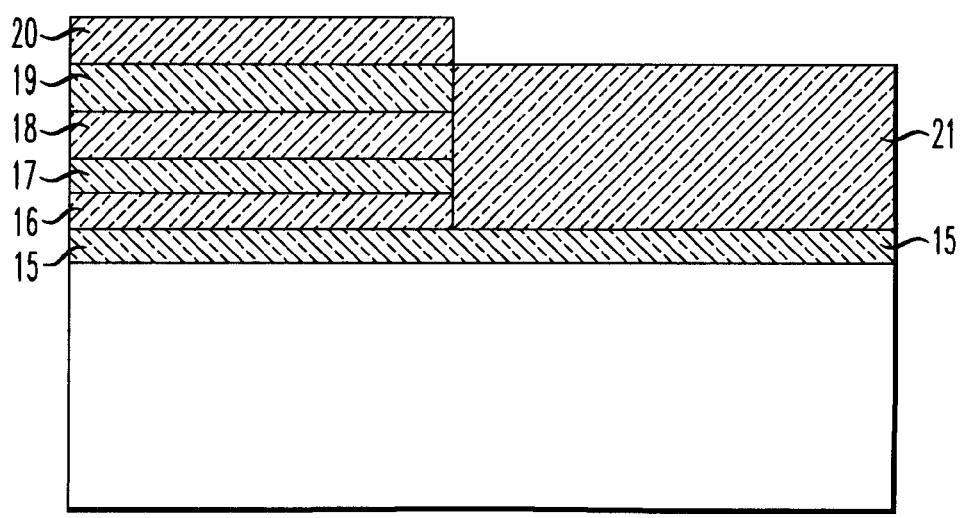

In order to prevent morphology which can results in a mesa bulge, as illustrated in FIGS. 5a and 5b, (which are cross-sectional views along lines 5a—5a and 5b—5b respectively of FIG. 11) a semiconductor layer, 21, was epitaxially grown in the area etched away in the previous step.

In this example, the layer was p-type InP, but could be other materials which have essentially the same lattice constant as layers 16–19, and a bandgap greater than that of the MQW layers 17. In the present example, InGaAs might be employed. The layer was grown by known techniques so that the layer extended to approximately the height of the top cladding layer, 19. In this example, the layer, 21, was grown by heating the structure for approx. 5 min. at a temperature of approx. 650 deg. C. while exposing the structure to Trimethyl Indium and Phosphine gas. This layer planarizes the entire wafer, negating the morphology induced by the lateral taper etch.

Figure 6:
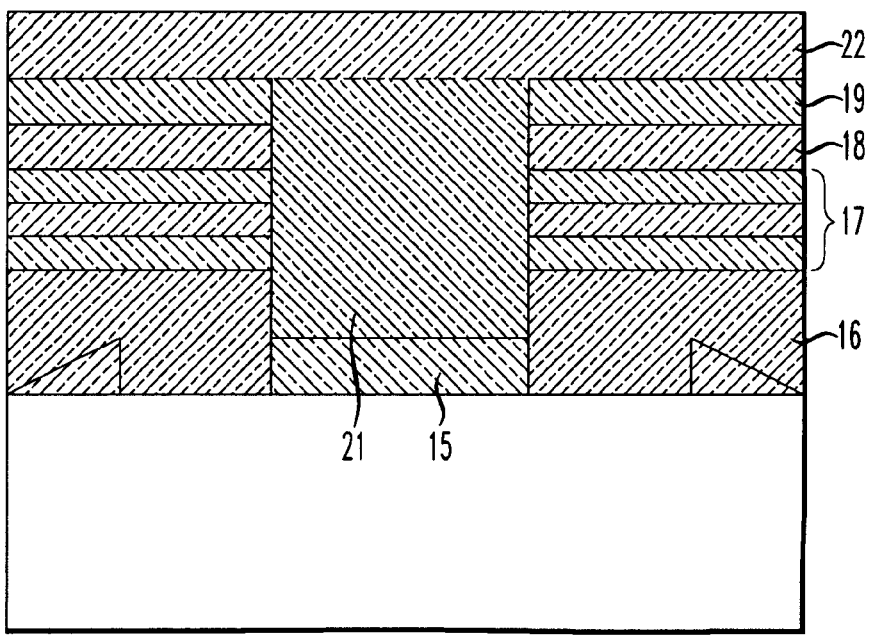

Then, as illustrated in FIG. 6, the oxide mask, 20, was stripped off, and an additional layer, 22, of InP was formed by epitaxial growth to cover the area of the semiconductor layer, 19, previously protected by the mask. The same material and technique were used as described above for the layer 21, but other materials and deposition techniques could be used. In general, the thickness of the layer, 22, will be in the range 3500–4500 angstroms. A thin layer of InGaAs (not shown) of approximately 600 Å may also be included over the InP.

Figure 7A:
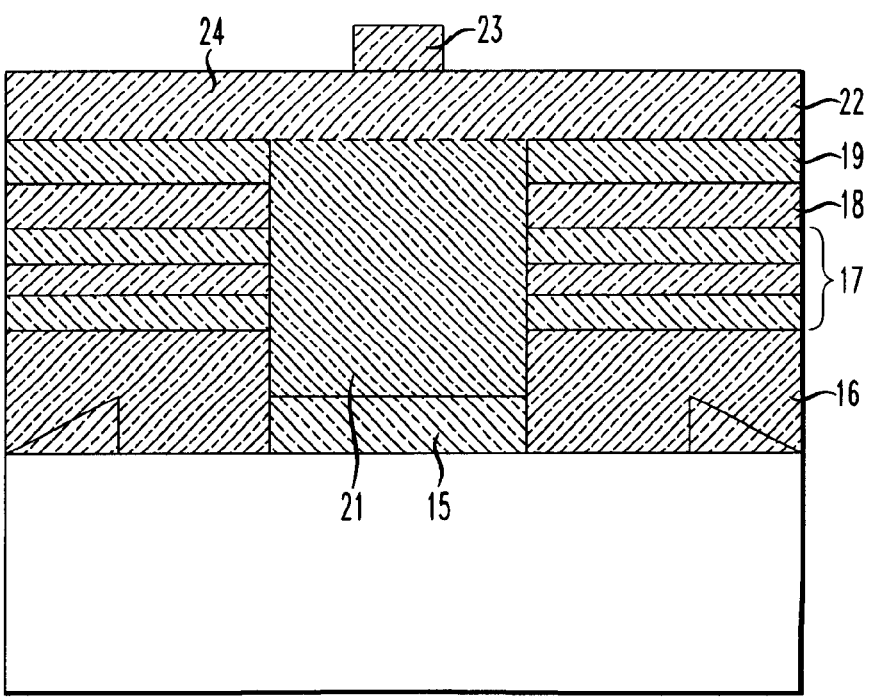
Figure 7B:
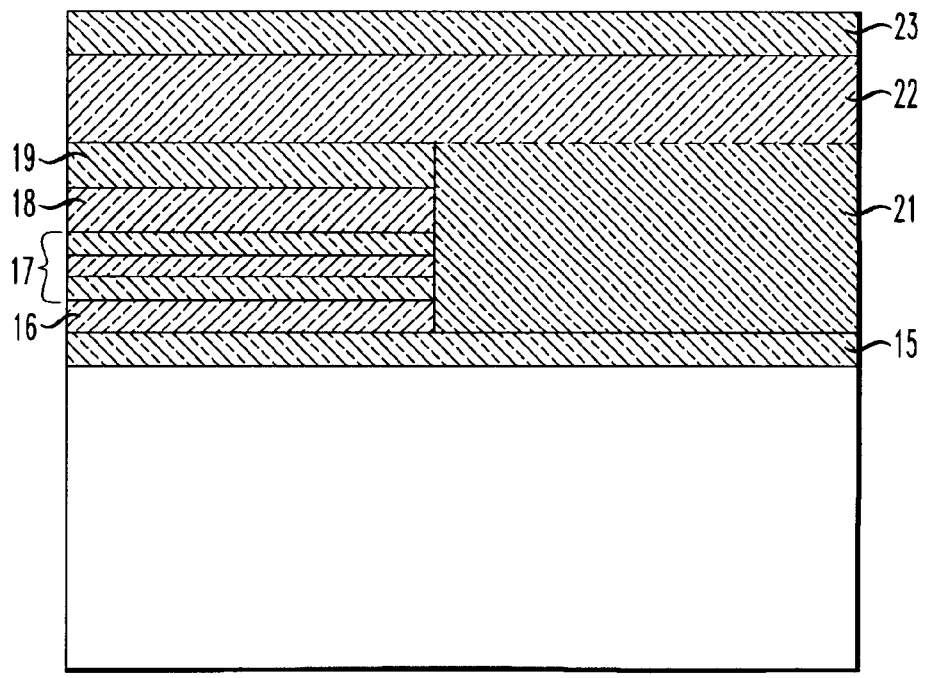
Figure 12:
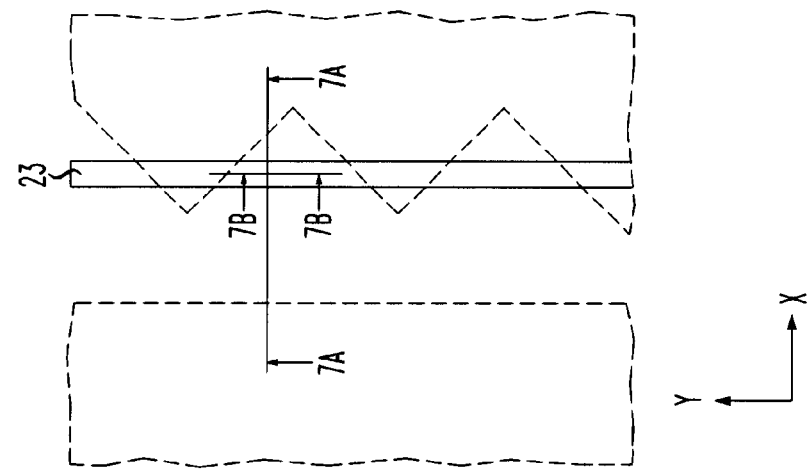
FIGS. 11 and 12 are plan views of a portion of a wafer during different stages of fabrication in accordance with the same embodiment.

Next, as illustrated in FIGS. 7a and 7b, which are cross-sectional views along lines 7a—7a and 7b—7b, respectively, of FIG. 12, an oxide-line mask, 23, was formed over layer 22 according to standard photolithographic techniques in order to define the mesa portion of the device. (The removed mask 20 is shown in phantom for purposes of illustration.) The mask material was $SiO_2$ and was deposited by plasma enhanced chemical vapor deposition. It will be noted that the layers 21 and 22 provide a planar surface, 24, on which the mask, 23, is formed rather than the uneven surface which existed after the tapered etch.

Figure 8:
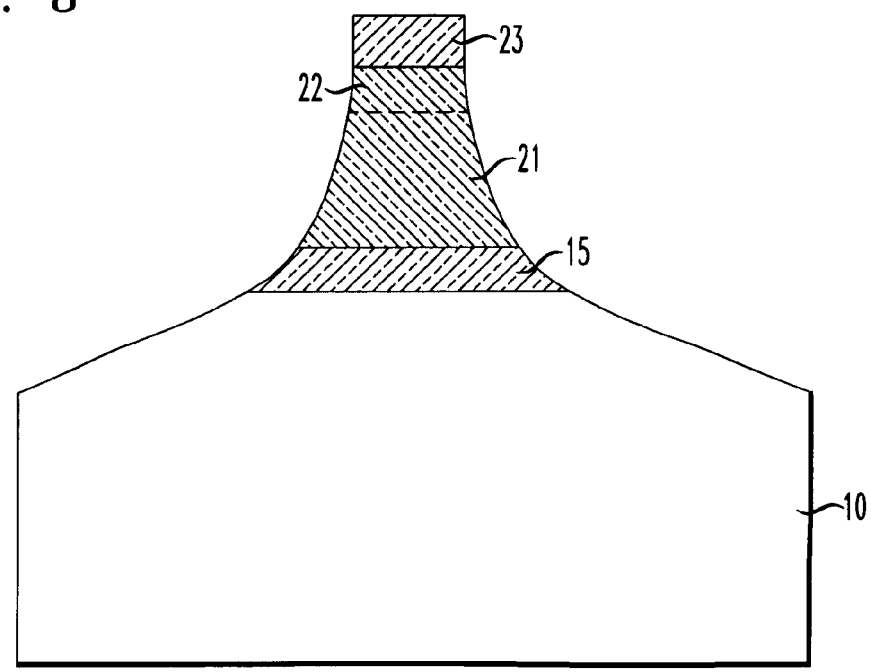
Figure 9:
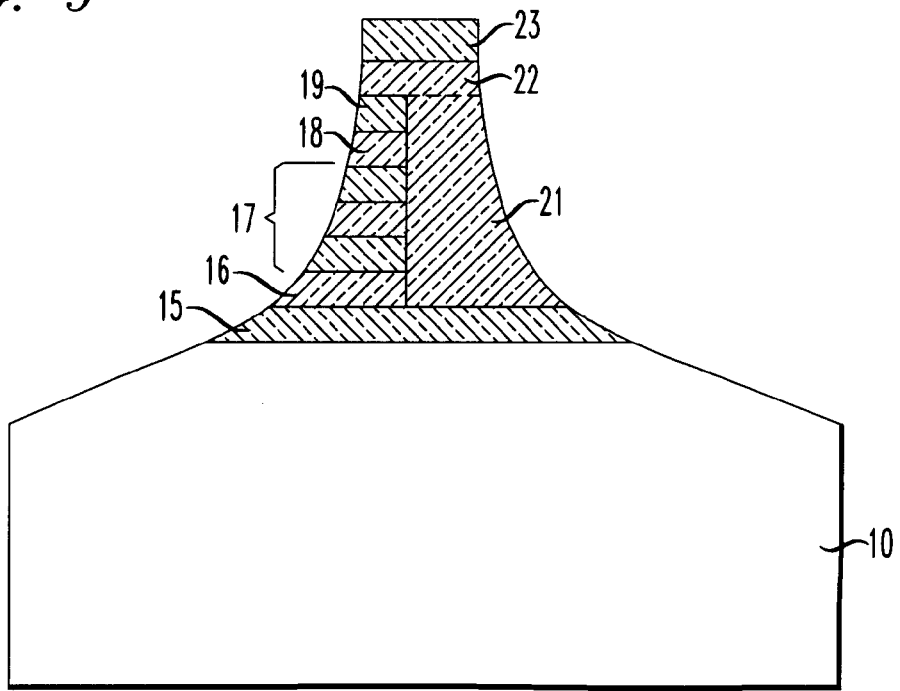
Figure 10:
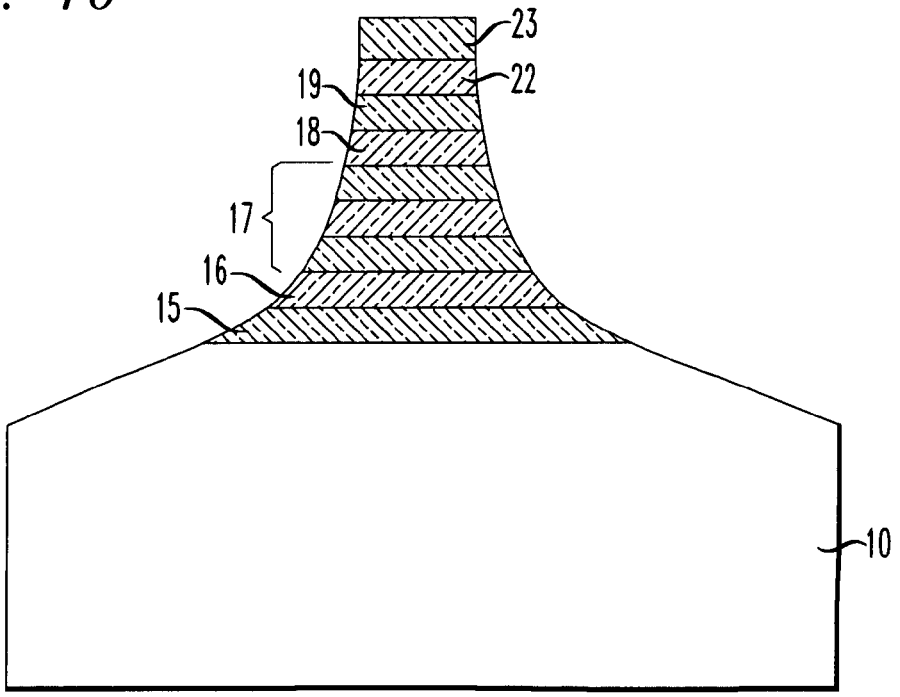
Figure 13:
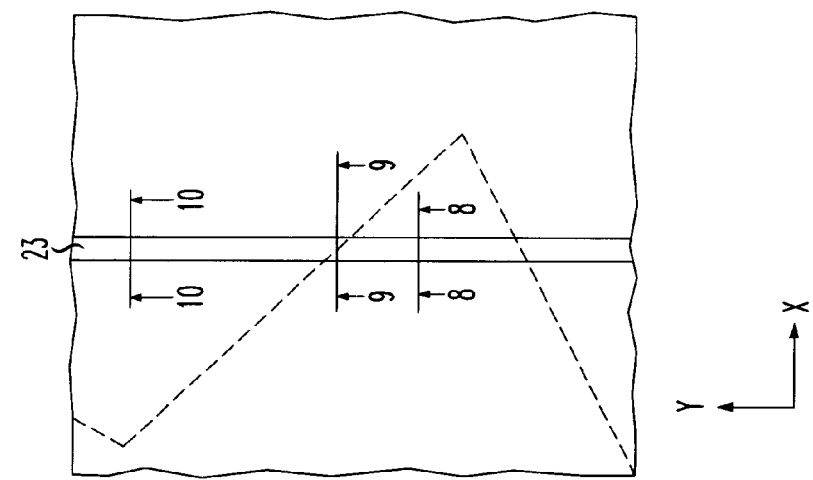
FIG. 13 is an enlarged view of the same portion of the wafer.

FIGS. 8, 9, and 10 illustrate the device after the mesa etch, taken along lines 8—8, 9—9 and 10—10, respectively, of FIG. 13. The etch was performed by wet chemical etching using HBr and peroxide for a period of approx. 150–180 sec. The planar surface, produced as a result of the planarization layers 21 and 22, was found to substantially reduce or eliminate the mesa bulges which would otherwise form after the mesa portions were etched. It will be appreciated that, as a result of the lateral taper etch, light from the quantum well layers, 17, will be coupled into the waveguide, 15, and expanded therein. Since the mesa bulge has been substantially eliminated, there will be no interference with this coupling. The reduction of the bulge will also ensure that the device remains single mode, which is important for communication applications.

While the invention has been described with respect to the fabrication of an expanded beam laser, it will be appreciated that the invention may be used for any mesa geometry device where a lateral taper etch has been performed. A "lateral taper etch" is intended to include any etching step or steps which removes varying depths of one or more layers along a dimension of the device. In the particular embodiment of the expanded beam laser described herein, layers 16–19 are etched or not etched to create a "step" along the x-direction, the position of the step varying along the y-direction. Further, although the expanded beam laser described herein was InP-based, the laser could also be GaAs-based with layers compatible therewith known in the art.

What is claimed is:

1. A method of fabricating an optoelectronic device comprising the steps of:

selectively etching at least a first semiconductor layer located on a semiconductor wafer so as to create a lateral taper etched region in said first semiconductor layer; then forming a material within said etched region so as to make said material substantially planar with said first semiconductor layer; then performing a second etch over a portion of the etched region to form an optoelectronic device mesa geometry.

2. The method according to claim 1 wherein the material is a semiconductor material.

3. The method according to claim 2 wherein the material comprises InP.

4. The method according to claim 1 wherein a plurality of semiconductor layers are etched, including a plurality of quantum well layers for light emission.

5. The method according to claim 4 wherein a waveguide is also formed over the wafer, and the lateral taper etch is performed so that light from the quantum well layers is coupled into the waveguide.

6. The method according to claim 1 wherein the lateral taper etch is performed by etching through a mask with a saw tooth pattern.

7. The method according to claim 6 wherein the material is formed in the etched region, and, subsequently, the mask is removed and an additional layer is formed over the area formerly covered by the mask.

8. The method according to claim 7 wherein the additional layer comprises said material.

* * * * *